(12) United States Patent
Okuno et al.

(10) Patent No.: US 7,745,276 B2
(45) Date of Patent: Jun. 29, 2010

(54) METHOD FOR MANUFACTURING SIC SEMICONDUCTOR DEVICE

(75) Inventors: Eiichi Okuno, Mizuho (JP); Hiroki Nakamura, Handa (JP); Naohiro Suzuki, Anjo (JP)

(73) Assignee: Denso Corporation, Kariya (JP)

( * ) Notice: Subject to any disclaimer, the term of this patent is extended or adjusted under 35 U.S.C. 154(b) by 15 days.

(21) Appl. No.: 12/068,263

(22) Filed: Feb. 5, 2008

(65) Prior Publication Data

US 2008/0206941 A1    Aug. 28, 2008

(30) Foreign Application Priority Data

Feb. 23, 2007    (JP) .............................. 2007-043782

(51) Int. Cl.
*H01L 21/8234*    (2006.01)

(52) U.S. Cl. ...................... 438/198; 438/151; 438/396; 438/261; 438/519; 257/77; 257/327; 257/E21.409; 257/E29.012

(58) Field of Classification Search ................. 438/198, 438/151, 396, 261, 519; 257/287, 263, 77, 257/327, E21.409, E29.012
See application file for complete search history.

(56) References Cited

U.S. PATENT DOCUMENTS

| 5,184,204 A | 2/1993 | Mihara et al. |
| 6,057,558 A | 5/2000 | Yamamoto et al. |
| 6,096,607 A | 8/2000 | Ueno |
| 6,150,671 A | 11/2000 | Harris et al. |
| 6,297,100 B1 | 10/2001 | Kumar et al. |
| 6,764,963 B2 | 7/2004 | Fukuda et al. |
| 7,019,344 B2 * | 3/2006 | Singh .......................... 257/263 |
| 7,221,010 B2 * | 5/2007 | Ryu ............................. 257/287 |

(Continued)

FOREIGN PATENT DOCUMENTS

WO    WO 97/36313    10/1997

OTHER PUBLICATIONS

Office Action dated Feb. 24, 2009 in corresponding Japanese Patent Application No. 2007-043782 (English Translation provided).
European Search Report issued by the European Patent Office on Feb. 27, 2009 in connection with European patent application No. 08002308.8-2203, which corresponds to U.S. Appl. No. 12/068,263.

*Primary Examiner*—Matthew Smith
*Assistant Examiner*—Wilner Jean Baptiste
(74) *Attorney, Agent, or Firm*—Posz Law Group, PLC

(57) ABSTRACT

A method for manufacturing a SiC semiconductor device includes: preparing a SiC substrate having a (11-20)-orientation surface; forming a drift layer on the substrate; forming a base region in the drift layer; forming a first conductivity type region in the base region; forming a channel region on the base region to couple between the drift layer and the first conductivity type region; forming a gate insulating film on the channel region; forming a gate electrode on the gate insulating film; forming a first electrode to electrically connect to the first conductivity type region; and forming a second electrode on a backside of the substrate. The device controls current between the first and second electrodes by controlling the channel region. The forming the base region includes epitaxially forming a lower part of the base region on the drift layer.

17 Claims, 13 Drawing Sheets

U.S. PATENT DOCUMENTS

| | | |
|---|---|---|
| 2003/0034495 A1 | 2/2003 | Casady et al. |
| 2003/0042549 A1 | 3/2003 | Fujihira et al. |
| 2006/0057796 A1 | 3/2006 | Harada et al. |
| 2006/0108589 A1 | 5/2006 | Fukuda et al. |
| 2007/0045631 A1* | 3/2007 | Endo et al. .................... 257/77 |
| 2008/0185594 A1 | 8/2008 | Frisina et al. |

* cited by examiner

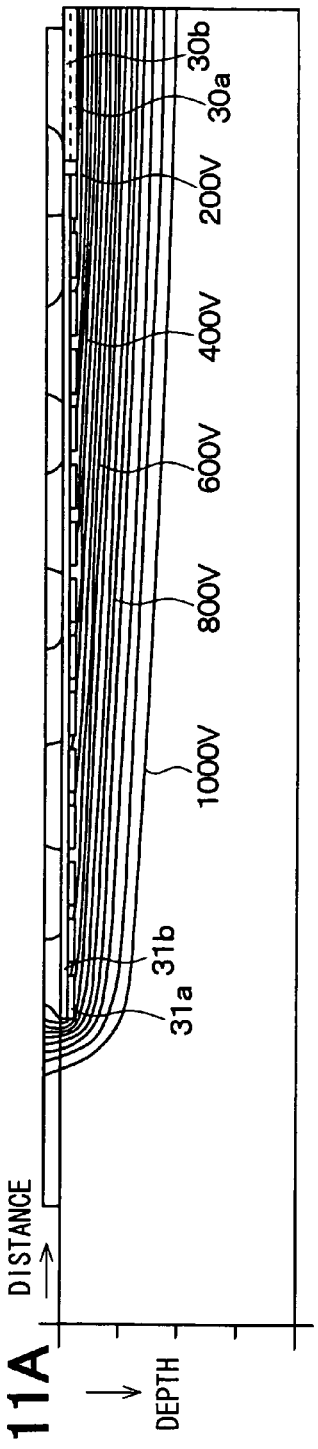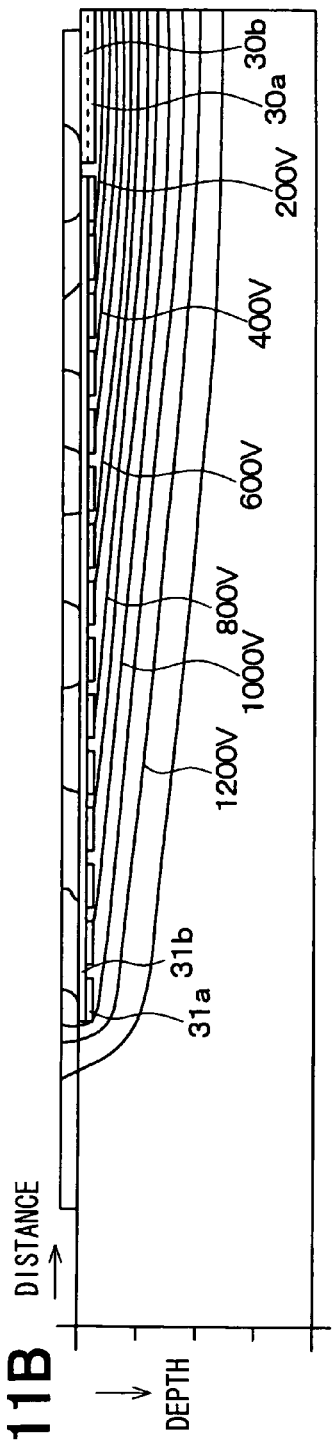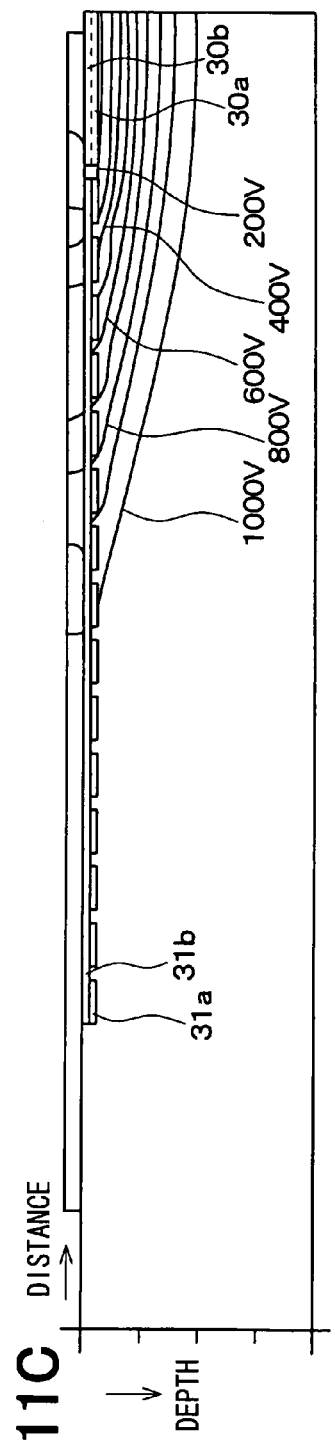

METHOD FOR MANUFACTURING SIC SEMICONDUCTOR DEVICE

CROSS REFERENCE TO RELATED APPLICATION

This application is based on Japanese Patent Application No. 2007-43782 filed on Feb. 23, 2007, the disclosure of which is incorporated herein by reference.

FIELD OF THE INVENTION

The present invention relates to a method for manufacturing a SiC semiconductor device.

BACKGROUND OF THE INVENTION

JP-A-2003-69012 corresponding to U.S. Pat. No. 6,764,963 discloses the following with respect to SiC semiconductor devices using an a-face where the plane direction of a crystal face has a (11-20)-surface orientation for a channel: the channel mobility with MOS structure can be enhanced by carrying out hydrogen annealing or treatment in a wet atmosphere. Specifically, the channel mobility is enhanced by selecting a concentration or temperature for hydrogen annealing or a wet atmosphere. The present inventors verified that the channel mobility can be spectacularly enhanced by taking the following measure: an (11-20)-orientation face, i.e., a-face, is subjected to wet oxidation, and the temperature is lowered to 600° C. in the wet atmosphere to terminate defect in an oxide film/Sic interface by hydrogen. (Refer to Japanese Patent Application publication No. 2007-96263 corresponding to US Patent Application No. 2007-0045631-A1.)

It is known that Basal Plane Dislocation (BPD) typified by stacking fault is prone to occur in an (11-20)-orientation face. For this reason, a problem of the passage of a leakage current arising from BPD occurs when a power device, such as MOS-FET and PN diode, is formed over a (11-20)-orientation face.

To cope with this, a power device was formed over a (11-20)-orientation face and the causes of leakage suspected to be caused by BPD were investigated. As the result, it was found that the following took place when ion implantation was carried out: even though activation heat treatment is carried out at 1500° C. or higher for curing a crystal defect and activating ion species, BPD cannot be reduced and on the contrary, it is increased and this increases leakage.

An example will be taken. In vertical power MOSFET using a planar channel of SiC, a p-well layer is formed by taking the following measure: p type dopant, such as Al or B, is ion implanted into the surface part of an n– type or n+ type wafer formed by laminating an n– type layer over an n+ type substrate using a mask open in a desired position. For this reason, leakage arising from BPD is caused at a PN junction by activation heat treatment after the ion implantation.

Thus, it is required to suppress leakage at a PN junction having a function of holding high voltage in a power device formed over a (11-20)-orientation face and thus suppress decline in the functions of the power device due to leakage.

SUMMARY OF THE INVENTION

In view of the above-described problem, it is an object of the present disclosure to provide a method for manufacturing a SiC semiconductor device.

According to a first aspect of the present disclosure, a method for manufacturing a silicon carbide semiconductor device includes: preparing a substrate made of silicon carbide having a (11-20)-orientation surface as a principal surface; forming a drift layer having a first conductivity type on the substrate; forming a base region having a second conductivity type in a surface portion of the drift layer by doping a second conductivity type impurity; forming a first conductivity type region in the base region in such a manner that the first conductivity type region has an impurity concentration higher than that of the drift layer; forming a channel region having the first conductivity type on a surface of the base region to couple between the drift layer and the first conductivity type region through a JFET region that is formed between base region; forming a gate insulating film on a surface of the channel region; forming a gate electrode on the gate insulating film; forming a first electrode to electrically connect to the first conductivity type region; and forming a second electrode on a backside of the substrate. The device is capable of controlling current between the first electrode and the second electrode through the first conductivity type region and the drift layer by controlling a channel formed in the channel region with an applied voltage to the gate electrode, and the forming the base region includes forming a lower part of the base region on the drift layer by an epitaxial growth method, the lower part contacting the drift layer.

As mentioned above, the lower part of the base region is formed by epitaxial growth, not by ion implantation. This makes it possible to suppress the occurrence of leakage arising from BPD at a PN junction formed between the drift layer and the lower part of the base region. That is, it can be suppressed at a PN junction requiring a function of holding high voltage. Therefore, it is possible to suppress leakage at a PN junction having a function of holding high voltage in a power device formed over an (11-20) face and to suppress decline in the functions of the power device due to leakage.

According to a second aspect of the present disclosure, a method for manufacturing a silicon carbide semiconductor device includes: preparing a substrate made of silicon carbide having a (11-20)-orientation surface as a principal surface; forming a drift layer having a first conductivity type on the substrate; forming a base region having a second conductivity type in a surface portion of the drift layer by doping a second conductivity type impurity; forming a first conductivity type region in the base region in such a manner that the first conductivity type region has an impurity concentration higher than that of the drift layer; forming a gate insulating film on a surface portion of the base region between the drift layer and the first conductivity type region, the surface portion providing a channel; forming a gate electrode on the gate insulating film; forming a first electrode to electrically connect to the first conductivity type region; and forming a second electrode on a backside of the substrate. The device is capable of controlling current between the first electrode and the second electrode through the first conductivity type region and the drift layer by controlling the channel with an applied voltage to the gate electrode, and the forming the base region includes forming a lower part of the base region on the drift layer by an epitaxial growth method, the lower part contacting the drift layer.

In the above device, it is possible to suppress leakage at a PN junction having a function of holding high voltage in a power device formed over an (11-20) face and to suppress decline in the functions of the power device due to leakage.

BRIEF DESCRIPTION OF THE DRAWINGS

The above and other objects, features and advantages of the present invention will become more apparent from the following detailed description made with reference to the accompanying drawings. In the drawings:

FIGS. 11A to 11C are electric potential distribution charts respectively indicating results obtained by investigating the electric potential distribution of a peripheral region under high drain voltage with the intervals between peripheral region lower parts set to 1.0 μm, 1.5 μm, and 2.2 μm;

DETAILED DESCRIPTION OF THE PREFERRED EMBODIMENTS

First Embodiment

Figure 1:
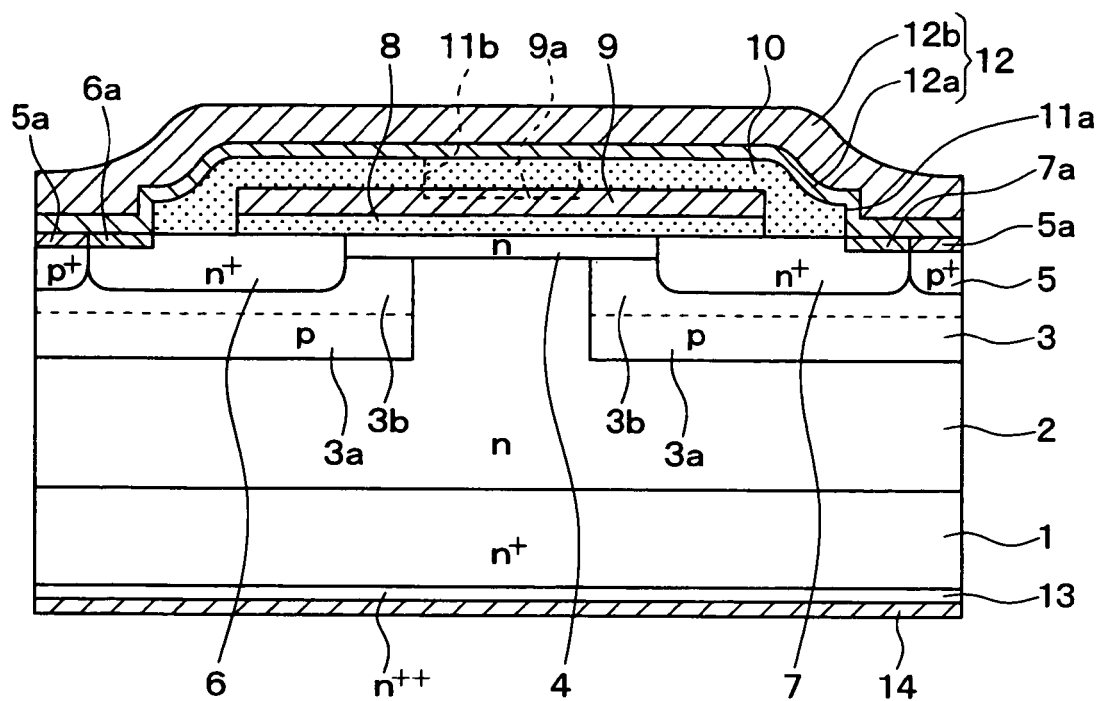
FIG. 1 is a drawing illustrating the cross section configuration of a planar MOSFET in a first embodiment.

In this embodiment, an accumulation planar MOSFET as a vertical power MOSFET of SiC semiconductor is formed. FIG. 1 illustrates the cross section configuration of the planar MOSFET, and FIG. 2A to FIG. 4D illustrate a manufacturing process for the planar MOSFET illustrated in FIG. 1. Description will be given to the structure of the planar MOSFET in this embodiment and a manufacturing method with reference to these drawings.

As illustrated in FIG. 1, the planar MOSFET is formed over an n+ type substrate 1 composed of SiC with its one side taken as a principal surface. For the n+ type substrate 1, for example, one that is of 4H—SiC and whose principal surface is, for example, a (11-20)-orientation face and whose impurity concentration is $1\times10^{19}$ cm$^{-3}$ or so is used.

An epitaxially grown n type drift layer 2 composed of SiC is formed over the principal surface of the substrate 1. The n type drift layer 2 is, for example, so constructed that the impurity concentration is $5\times10^{15}$ cm$^{-3}$ or so and the thickness is 10 μm.

In the surface part of the n type drift layer 2, multiple p type base regions 3 are formed so that they are disposed at predetermined intervals. The lower part 3a of each p type base region 3 is formed by epitaxial growth and the upper part 3b is formed by ion implantation. The lower parts 3a of the p type base regions 3 are, for example, so constructed that the impurity concentration is $1\times10^{19}$ cm$^{-3}$ and the thickness is 0.3 μm or so. The upper parts 3b are, for example, so constructed that the impurity concentration is $0.5\times10^{15}$ cm$^{-3}$ to $1\times10^{19}$ cm$^{-3}$ and the thickness is 0.4 μm or so. The total thickness is set to 0.7 μm or so.

Over the p type base regions 3, an n type channel layer (hereafter, referred to as channel epi-layer) 4 for constructing the epitaxially grown type channel region is formed so that the n type drift layer 2 and n+ type source regions 6, 7 described later are coupled together. This channel epi-layer 4 is, for example, so constructed that the concentration is $1\times10^{16}$ cm$^{-3}$ or so and the film thickness (depth) is 0.3 μm or so.

A p+ type contact region 5 is so formed that it penetrates the channel epi-layer 4 and reaches the p type base regions 3. This contact region 5 is, for example, so constructed that the concentration is as high as $3\times10^{20}$ cm$^{-3}$ or above and the depth is 0.4 μm.

The n+ type source regions 6, 7 are formed with the channel epi-layer 4 in-between inside the contact region 5. The n+ type source regions 6, 7 are, for example, so constructed that the concentration is as high as $3\times10^{20}$ cm$^{-3}$ or above and the depth is 0.4 μm.

Of the surface part of the channel epi-layer 4, a portion positioned above the p type base regions 3 is taken as a channel region. A gate oxide film 8, for example, 52 nm in film thickness, is formed so that it covers at least the surface of the channel region.

In the surface of the gate oxide film 8, a gate electrode 9 composed of polysilicon doped with, for example, an n type impurity (e.g., P (phosphorus)) is patterned.

An interlayer insulating film 10 composed of, for example, BPSG is formed so that it covers the remnants of the gate electrode 9 and the gate oxide film 8. In the interlayer insulating film 10 and the gate oxide film 8, the following are formed: a contact hole 11a communicating with the contact region 5 and the n+ type source regions 6, 7; a contact hole 11b (in a cross section different from that in FIG. 1) communicating with the gate electrode 9; and the like. The contact holes 11a, 11b are provided therein with contact portions 5a, 6a, 7a, 9a composed of Ni or Ti/Ni electrically connected to the contact region 5, n+ type source regions 6, 7, and gate electrode 9. Further, they are provided with a source electrode 12 constructed of a bottom wiring electrode 12a composed of Ti and a wiring electrode 12b composed of Al and a gate wiring.

On the back side of the substrate 1, there is formed an n+ type drain contact region 13 of higher concentration than that of the substrate 1. In the drain contact region 13, there is formed a drain electrode 14 composed of, for example, Ni that makes a back surface electrode. With this structure, the planar MOSFET is constructed.

In the thus constructed planar MOSFET, the channel epi-layer 4, that is, the channel region is used as a current pathway, and a current is passed between the n+ type source regions 6, 7 and the drain contact region 13 disposed upstream and downstream of the current pathway. Applied voltage to the gate electrode 9 is controlled, and the width of a depletion type layer formed in the channel region is thereby controlled to control a current passed there. Thus, the current passed between the n+ type source regions 6, 7 and the drain contact region 13 can be controlled.

Description will be given to a manufacturing method for the planar MOSFET in this embodiment with reference to the sectional views in FIG. 2A to FIG. 4D illustrating a manufacturing process for the planar MOSFET.

Figure 2A:
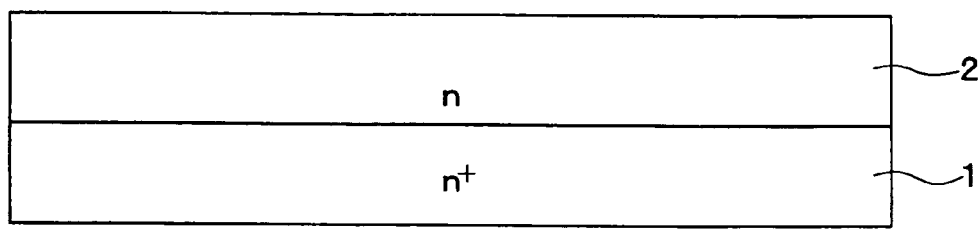
FIGS. 2A to 2D are a set of sectional views illustrating manufacturing steps for the planar MOSFET illustrated in FIG. 1.

[Step Illustrated in FIG. 2A]

The n+ type substrate 1 is prepared, and the n type drift layer 2 is epitaxially grown over the principal surface of the substrate 1 so that the impurity concentration is $1 \times 10^{16}$ cm$^{-3}$ or so and the thickness is 10 μm.

Figure 2B:
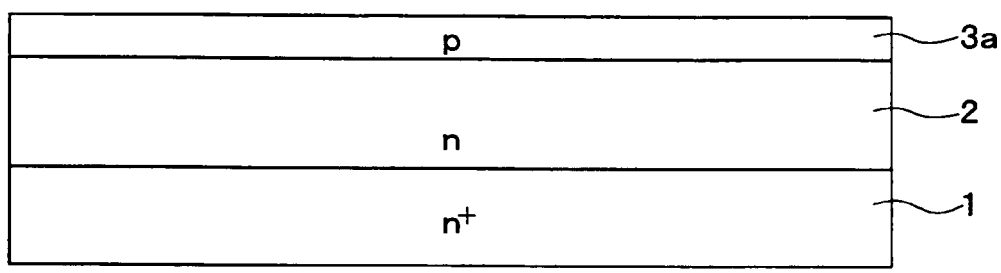

[Step Illustrated in FIG. 2B]

The lower part 3a of the p type base region 3 is formed over the surface of the n type drift layer 2 by epitaxial growth with, for example, boron doped as a p type impurity so that the impurity concentration $1 \times 10^{19}$ cm$^{-3}$ or so.

Figure 2C:
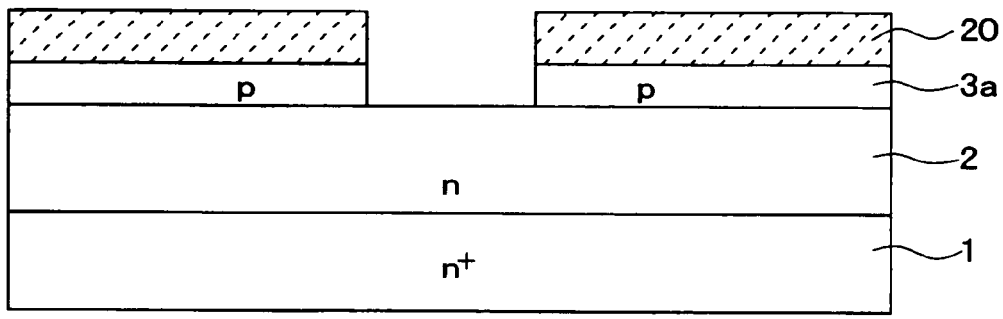

[Step Illustrated in FIG. 2C]

The mask 20 is placed over the lower part 3a, and then etching is carried out using this mask 20. Thus, unwanted portions of the lower part 3a, specifically, portions other than those corresponding to the p type base regions 3 are removed to divide the lower part 3a into more than one part.

Figure 2D:
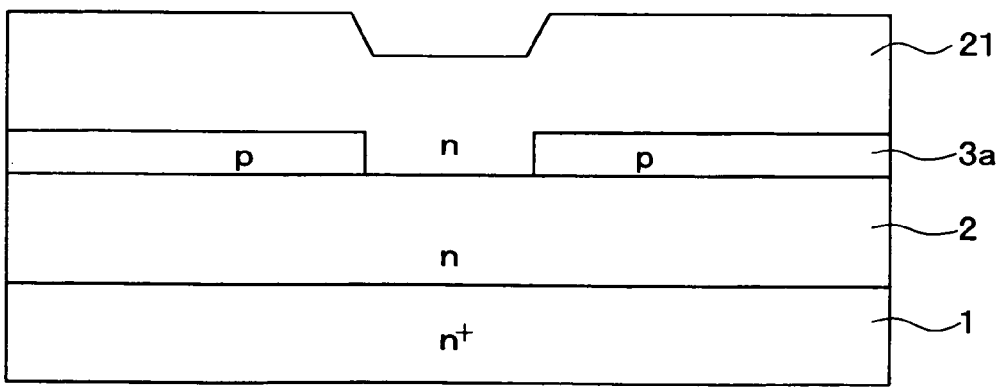

[Step Illustrated in FIG. 2D]

An n type layer 21 is formed over the lower parts 3a and the exposed portion of the n type drift layer 2. At this time, the film formation is so controlled that the thickness of the n type layer 21 is equal to or larger than the thickness of the p type base regions 3. For example, it is desirable that the thickness of the n type layer 21 should be 1 μm or so.

Figure 3A:
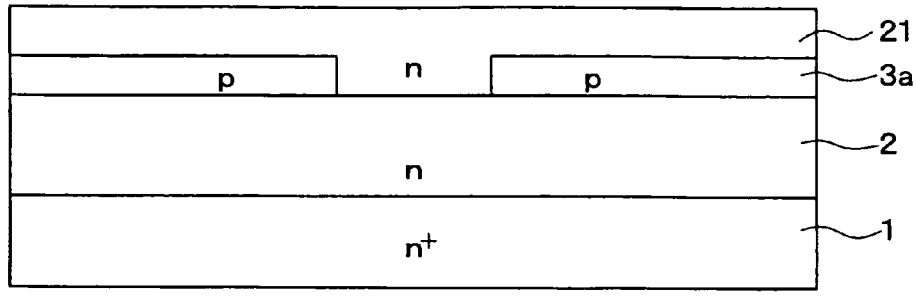
FIGS. 3A to 3D are a set of sectional views illustrating manufacturing steps for the planar MOSFET, following those in FIG. 2D.

[Step Illustrated in FIG. 3A]

The n type layer 21 is polished by CMP (Chemical Mechanical Polishing) or the like and planarized. At this time, the amount of polishing is so controlled that the thickness of the portion of the n type layer 21 left over the lower parts 3a is equal to the upper parts 3b of the p type base regions 3.

Figure 3B:
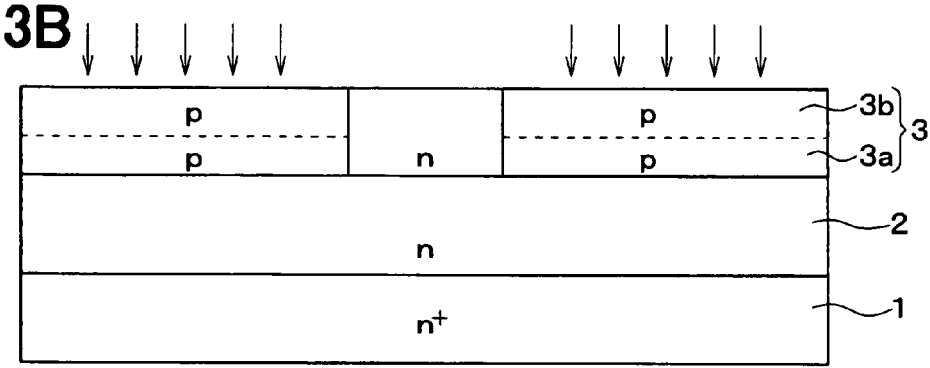

[Step Illustrated in FIG. 3B]

A mask (not shown) of, for example, LTO is formed, and a photolithography step is carried out to open the mask at portions corresponding to the regions where the p type base regions 3 are to be formed. Boron as the p type impurity is ion implanted into the surface part of the n type layer 21 from above the mask. Thereafter, the mask is removed and then activation heat treatment is carried out at 1600° C. for 30 minutes to diffuse the impurity in the <11-20> direction. The upper parts 3b of the p type base regions 3 are thereby formed with an n type impurity concentration of $1 \times 10^{19}$ cm$^{-3}$ or so. Thus, the lower parts 3a and the upper parts 3b are joined together, and the p type base regions 3, 0.7 μm or so in depth, are formed. Further, the portion of the n type layer 21 that was not ion implanted with the p type impurity is left as part of the n type drift layer 2.

In this example, boron is used for the p type impurity. It is known that the diffusion coefficient of boron at the (11-20)-orientation face is dramatically higher than at any other face. This makes it possible to form a PN junction over the (11-20)-orientation face by boron ion implantation and thereafter carry out activation heat treatment and to thereby shift the PN junction area into the high-quality drift layer 2. Thus, a PN junction with low leakage current can be formed.

Alternatively, a mask (not shown) of LTO or the like is formed, and a photolithography step is carried out to open the mask at portions corresponding to the regions where the p type base regions 3 are to be formed. Aluminum as the p type impurity is ion implanted into the surface part of the n type layer 21 from above the mask. In this case, aluminum is implanted at multiple levels with different energies to form the p type base layers of uniform concentration. Implantation energy of an acceleration voltage of 10 keV to 700 keV is used to carry out ion implantation at five different levels. Thus, an n type impurity distribution with a uniform depth of 0.7 μm can be formed. After the mask is removed, activation heat treatment is carried out at 1600° C. for 30 minutes to activate aluminum. Thus, the upper parts 3b of the p type base regions 3 are formed with an n type impurity concentration of $1 \times 10^{19}$ cm$^{-3}$ or so. As a result, the lower parts 3a and the upper parts 3b are joined together, and the p type base regions 3, 0.7 μm or so in depth, are formed. Further, the portion of the n type layer 21 that was not ion implanted with the p type impurity is left as part of the n type drift layer 2.

Figure 3C:
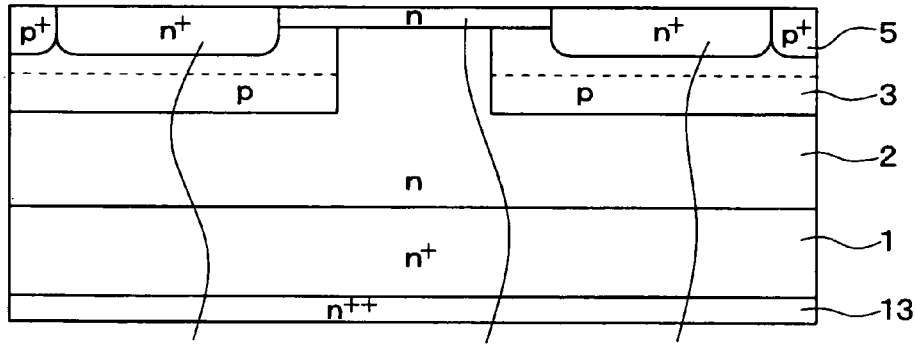

[Step Illustrated in FIG. 3C]

Over the p type base regions 3, the channel epi-layer 4, for example, $1 \times 10^{16}$ cm$^{-3}$ or so in concentration and 0.3 μm in film thickness (depth), is epitaxially grown. A mask of, for example, LTO is formed, and a photolithography step is carried out to open the mask at a portion corresponding to the region where the contact region 5 is to be formed. Boron is ion implanted from above the mask. After the mask is removed, a mask of, for example, LTO is formed to protect the surface of the substrate, and then P is ion implanted from the back side of the substrate 1. After the mask is removed, a mask of, for example, LTO is formed again, and a photolithography step is carried out to open the mask at portions corresponding to the regions where the n+ type source regions 6, 7 are to be formed. Thereafter, for example, P is ion implanted as an n type impurity. After the mask is removed, activation heat treatment is carried out, for example, at 1600° C. for 30 minutes to activate the implanted p type impurity and n type impurity. Thus, the contact region 5, n+ type source regions 6, 7, and further drain contact region 13 are formed.

Figure 3D:
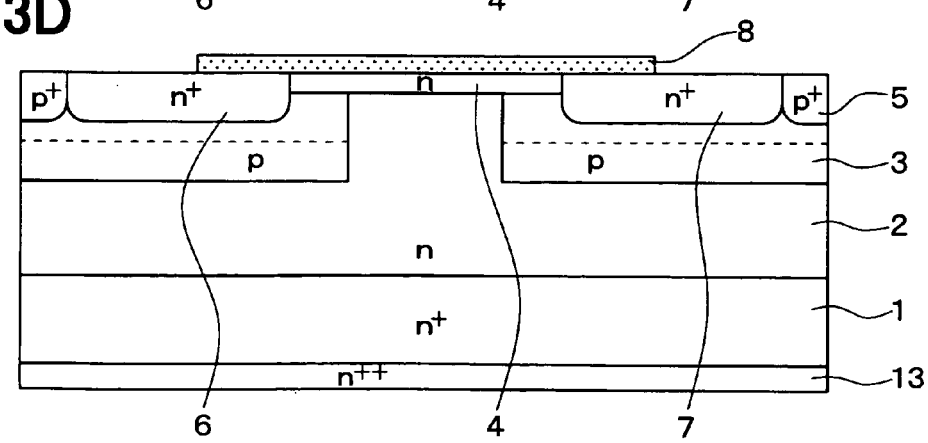

[Step Illustrated in FIG. 3D]

A gate oxide film formation process is carried out to form the gate oxide film 8. Specifically, the gate oxide film 8 is formed by gate oxidation using a wet atmosphere by a pyrogenic method.

Figure 4A:
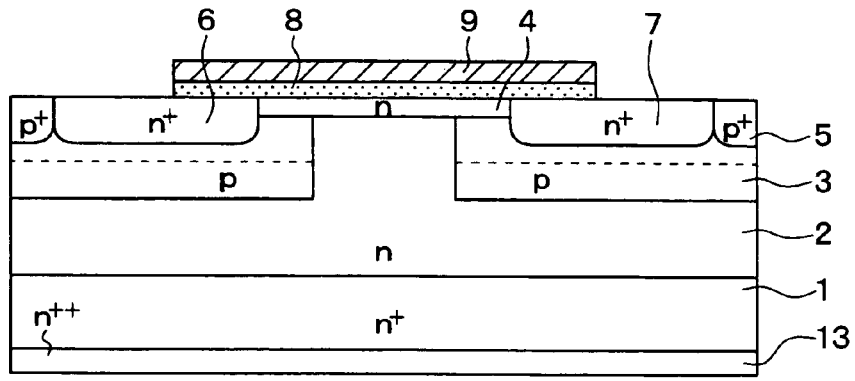
FIGS. 4A to 4D are a set of sectional views illustrating manufacturing steps for the planar MOSFET, following those in FIG. 3D.

[Step Illustrated in FIG. 4A]

A polysilicon type layer doped with an n type impurity is formed over the surface of the gate oxide film 8 to a thickness of 440 nm or so at a temperature of, for example, 600° C. Thereafter, using resist formed by photolithography etching as a mask, the polysilicon type layer and the gate oxide film 8 are patterned. Thus, the gate electrode 9 is formed.

Figure 4B:
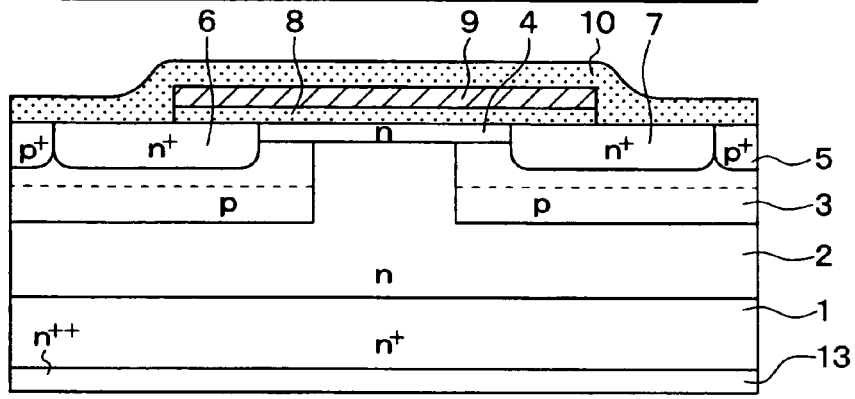

[Step Illustrated in FIG. 4B]

The interlayer insulating film 10 is formed. BPSG is formed to a thickness of 670 nm or so at 420° C. by, for example, plasma CVD, and thereafter reflow processing is carried out in a wet atmosphere, for example, at 930° C. for 20 minutes. Thus, the interlayer insulating film 10 is formed.

Figure 4C:
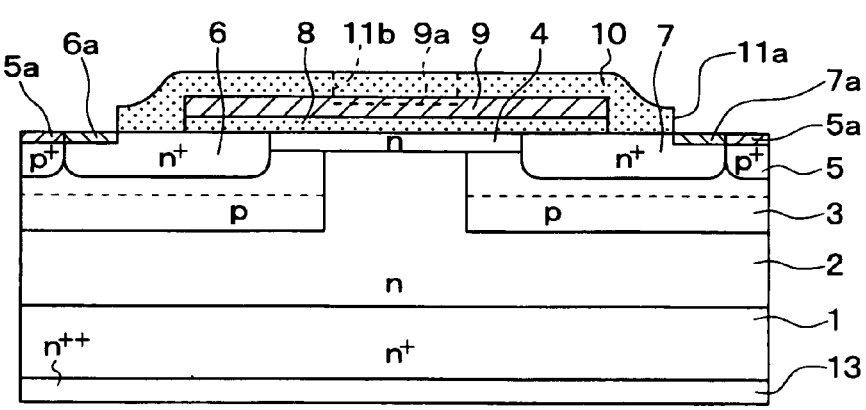

[Step Illustrated in FIG. 4C]

Using resist formed by, for example, photolithography etching as a mask, the interlayer insulating film 10 is patterned. Thus, the contact hole 11a communicating with the contact region 5 and the n+ type source regions 6, 7 are formed, and further the contact hole 11b communicating with the gate electrode 9 is formed in a different cross section.

Figure 4D:
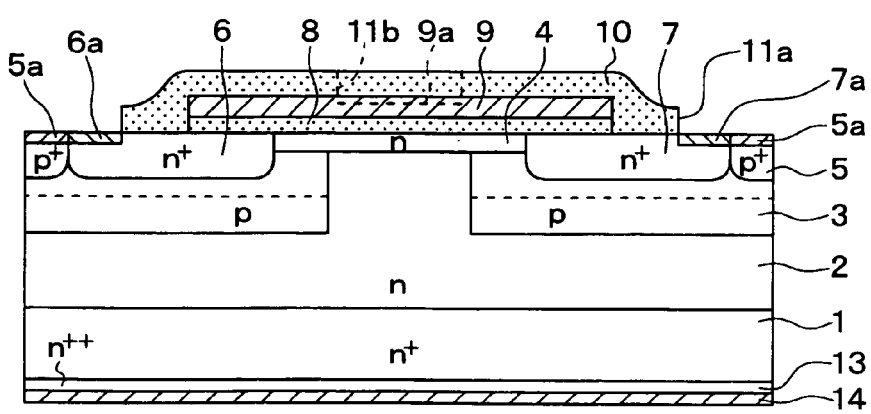

[Step Illustrated in FIG. 4D]

A contact metal layer composed of Ni or Ti/Ni is formed so that the contact holes 11a, 11b are filled therewith, and thereafter the contact metal layer is patterned. Thus, the contact portions 5a to 7a, 9a electrically connected to the contact region 5, n+ type source regions 6, 7, and gate electrode 9 are formed. The drain electrode 14 composed of Ni is formed on the back side of the substrate 1 so that it is in contact with the drain contact region 13. Electrode sintering is carried out by heat treatment in an Ar atmosphere at 700° C. or below to bring the contact portions 5a to 7a, 9a and the drain electrode 14 into ohmic contact. At this time, the contact region 5, n+ type source regions 6, 7, gate electrode 9, and drain contact region 13 are high in concentration as mentioned above. Therefore, the contact portions 5a to 7a and the drain electrode 14 are sufficiently brought into ohmic contact without a heat treatment step at high temperature.

The subsequent manufacturing steps are not shown in a drawing. However, the source electrode 12 constructed of the bottom wiring electrode 12a composed of Ti and the wiring electrode 12b composed of Al is formed and the gate wiring is formed in a cross section different from that illustrate in FIG. 1. As a result, the planar MOSFET illustrated in FIG. 1 is completed.

According to the manufacturing method for the planar MOSFET described up to this point, the lower parts 3a of the p type base regions 3 are formed by epitaxial growth, not by ion implantation. This makes it possible to suppress the occurrence of leakage arising from BPD at a PN junction formed between the n type drift layer 2 and the lower parts 3a of the p type base regions 3. That is, it can be suppressed at a PN junction requiring a function of holding high voltage. Therefore, it is possible to suppress leakage at a PN junction having a function of holding high voltage in a power device formed over an (11-20)-orientation face and to suppress decline in the functions of the power device due to leakage.

Second Embodiment

Figure 5A:
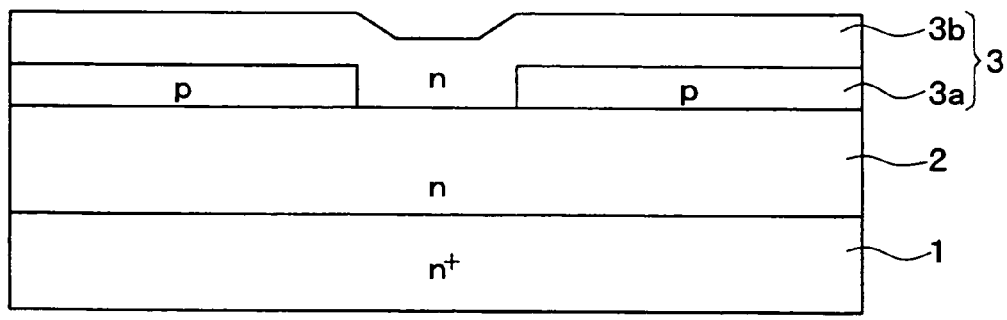
FIGS. 5A and 5B are a set of sectional views illustrating manufacturing steps for a planar MOSFET in a second embodiment.
Figure 5B:
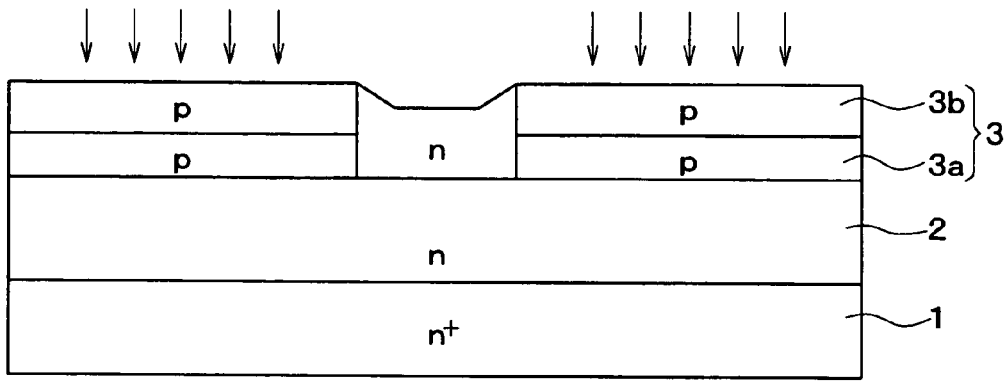

Some of the steps of forming the p type base regions 3 in the first embodiment may be modified. FIG. 5A to 5B are a set of sectional views illustrating the manufacturing process for the planar MOSFET in which the steps of FIG. 2D to FIG. 3B in the first embodiment are modified.

After the steps up to the step of FIG. 2C are carried out, the n type layer 21 is formed at the step illustrated in FIG. 5A. At this time, the film thickness of the n type layer 21 is so controlled that it is at the same level as that of the upper parts 3b of the p type base regions 3. Subsequently, the same ion implantation step as of FIG. 3B is carried out without polishing the n type layer 21 at the step illustrated in FIG. 5B, and the upper parts 3b of the p type base regions 3 are thereby formed. As a result, the lower parts 3a and the upper parts 3b are joined together, and the p type base regions 3 µm, 0.7 µm or so in depth, is formed. Further, the portion of the n type layer 21 that was not ion implanted with the p type impurity is left as part of the n type drift layer 2.

Controlling the film thickness of the n type layer 21 so that it is at the same level as that of the upper parts 3b of the p type base regions 3 makes it unnecessary to polish the n type layer 21. This makes it possible to simplify the manufacturing process for the planar MOSFET. In this case, the n type drift layer 2 is in such a shape that its top is recessed but this does not hinder the operation of the MOSFET at all.

Third Embodiment

In this embodiment, the same configuration as that of the PN junction of the planar MOSFET is also adopted for the peripheral region of the planar MOSFET illustrated in FIG. 1 for the enhancement of breakdown voltage. That is, the configuration is also adopted for a PN junction in the region encircling the cell region where the planar MOSFET is formed.

Figure 6:
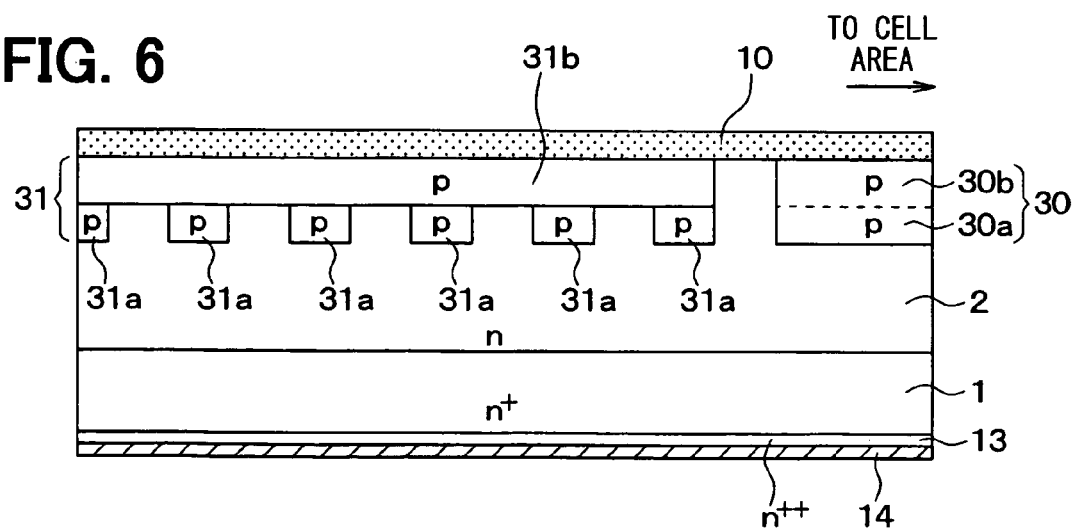
FIG. 6 is a sectional view of the peripheral region of a planar MOSFET in a third embodiment.

FIG. 6 is a sectional view of the peripheral region of a planar MOSFET. As illustrated in this drawing, the peripheral region includes the following in the surface part of the n type drift layer 2: a RESURF layer 30 of annular structure encircling the cell area; and a guard ring portion 31 formed between the RESURF layer 30 and the periphery of the cell area.

The RESURF layer 30 is constructed of a p type layer and is formed by extending a p type base region 3 of the element disposed on the most peripheral side of the cell area. Of the RESURF layer 30, the RESURF lower part 30a positioned in its lower part, forming a PN junction with the n type drift layer 2, is formed by epitaxial growth. It is, for example, so formed that the impurity concentration is $1 \times 10^{19}$ cm$^{-3}$ and the thickness is 0.3 µm or so. The RESURF upper part 30b positioned above the RESURF lower part 30a is, for example, so formed that the impurity concentration is $0.5 \times 10^{15}$ cm$^{-3}$ to $1 \times 10^{19}$ cm$^{-3}$ and the thickness is 0.4 µm or so.

The guard ring portion 31 is so constructed that multiple p type guard ring lower parts 31a are disposed at certain intervals and a p type guard ring upper part 31b is formed above the multiple p type guard ring lower parts 31a. When the impurity concentration of the drift layer is $5 \times 10^{15}$ cm$^{-3}$, for example, the p type guard ring lower parts are disposed at intervals of 1.1 µm to 2.2 µm or so (preferably, 1.5 µm). Specifically, the guard ring portion is so structured that the following is implemented: the p type base region 3 of the planar MOSFET disposed on the most peripheral side of the cell area is extended outward; the multiple guard ring lower parts 31a positioned at intervals and the guard ring upper part 31b are formed at its end; and the guard ring upper part 31b is formed on the upper face of each of the guard ring lower parts 31a. The multiple guard ring lower parts 31a are formed by epitaxial growth, for example, so that the impurity concentration $1 \times 10^{19}$ cm$^{-3}$ and the thickness is 0.3 µm or so. The guard ring upper part 31b is, for example, so formed that the impurity concentration $0.5 \times 10^{15}$ cm$^{-3}$ to $1 \times 10^{19}$ cm$^{-3}$ and the thickness is 0.4 µm or so.

FIGS. 7A to 7E illustrate the step of the formation of this peripheral region. The peripheral region formation step is carried out simultaneously with the above-mentioned steps in the manufacturing process for the planar MOSFET. Therefore, description will be given together with the description of the relation with the manufacturing process for the planar MOSFET.

Figure 7A:
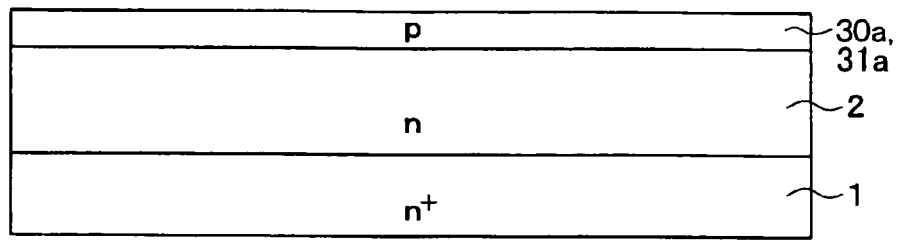
FIGS. 7A to 7E are a set of sectional views illustrating steps of forming the peripheral region illustrated in FIG. 6.

At the step illustrated in FIG. 7A, the n type drift layer 2 is formed in the principal surface of the n+ type substrate 1. Thereafter, the RESURF lower part 30a and the guard ring lower part 31a are formed by epitaxial growth of a p type layer. This step is carried out simultaneously with the epitaxial growth step of forming the lower part 3a of the p type base region 3 illustrated in FIG. 2B.

Figure 7B:
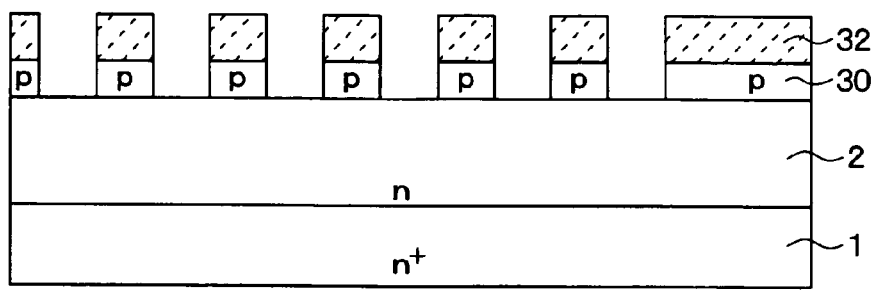

At the subsequent step illustrated in FIG. 7B, a mask 32 is placed over the RESURF lower part 30a and the guard ring lower part 31a. Thereafter, unwanted portions of the RESURF lower part 30a and the guard ring lower part 31a are removed by etching using this mask. Thus, a gap is formed between the RESURF lower part 30a and the guard ring lower part 31a, and further, the guard ring lower part 31a is also provided with gaps and divided into more than one. This step is carried out simultaneously with the step of removing unwanted portions from the lower part 3a using the mask 20, illustrated in FIG. 2C.

Figure 7C:
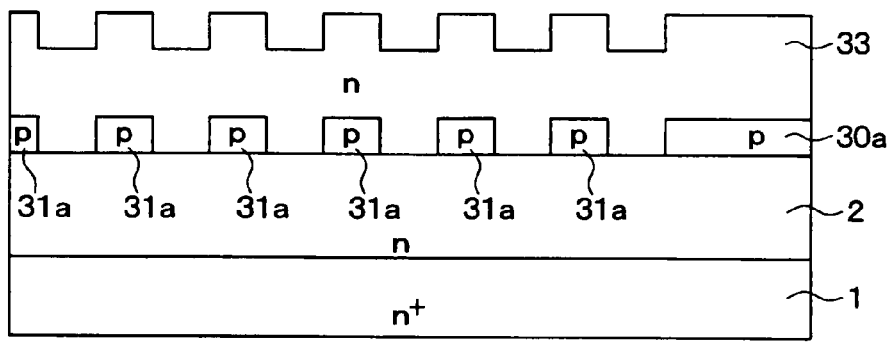

At the subsequent step illustrated in the FIG. 7C, an n type layer 33 is formed over the RESURF lower part 30a, guard ring lower parts 31a, and exposed portions of the n type drift layer 2. At this time, the film formation is so controlled that the thickness of the n type layer 33 is equal to or larger than that of the RESURF lower part 30a and the guard ring lower parts 31a. This step is also carried out simultaneously with the n type layer 21 formation step illustrated in FIG. 2D.

Figure 7D:
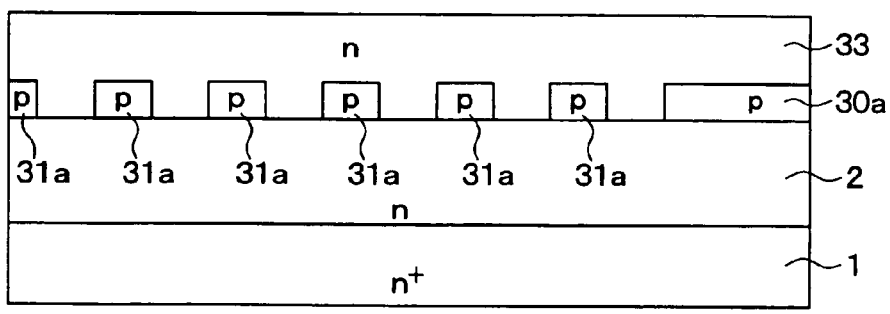

At the subsequent step illustrated in FIG. 7D, the n type layer 33 is polished by CMP or the like and planarized. At this time, the amount of polishing is so constructed that the thickness of the portions of the n type layer 33 left over the RESURF lower part 30a and the guard ring lower parts 31a is equal to that of the RESURF upper part 30a and the guard ring upper part 31b. This step can also be carried out simultaneously with the n type layer 21 planarization step illustrated in FIG. 3A.

Figure 7E:
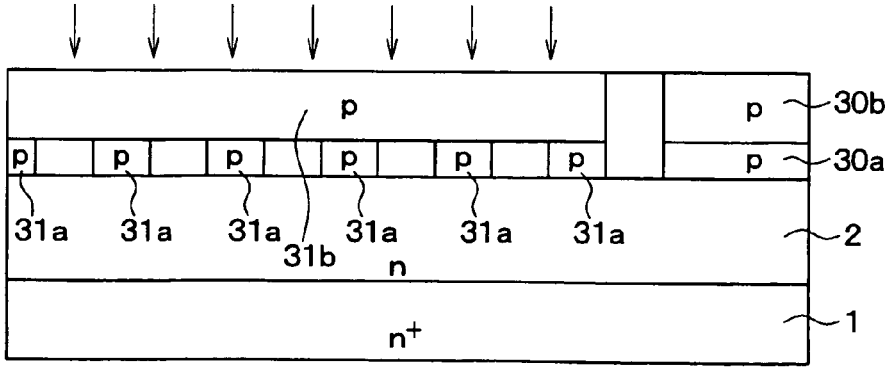

At the step illustrated in FIG. 7E, a mask (not shown) of, for example, LTO is formed, and then a photolithography step is carried out to open the mask at portions corresponding to the regions where the RESURF upper part 30b and the guard ring upper part 31b are to be formed. Boron as a p type impurity is ion implanted into the surface part of the n type layer 33 from above the mask. Thereafter, the mask is removed, and activation heat treatment is carried out at 1600° C. for 30 minutes to diffuse the impurity in the <11-20> direction. Thus, the RESURF upper part 30b and the guard ring upper part 31b are formed with an n type impurity concentration of, for example, $1 \times 10^{19}$ cm$^{-3}$ or so. Thus, the RESURF lower part 30a and the RESURF upper part 30b are jointed together, and further, the guard ring lower parts 31a and the guard ring upper part 31b are joined together. This step can also be carried out simultaneously with the step illustrated in FIG. 3B.

The guard ring upper part can also be formed by multi-level ion implantation using aluminum as the base layer is formed.

As mentioned above, the RESURF lower part 30a and the guard ring lower parts 31a are formed by epitaxial growth. This makes it possible to solve a problem of the occurrence of leakage at a PN junction arising from BPD by activation heat treatment after ion implantation. The problem can be solved even in the location of the boundary between the lower parts of the RESURF lower part 30a and guard ring lower parts 31a and the n type drift layer. This makes it possible to further enhance the breakdown voltage of the peripheral region.

Figure 8:
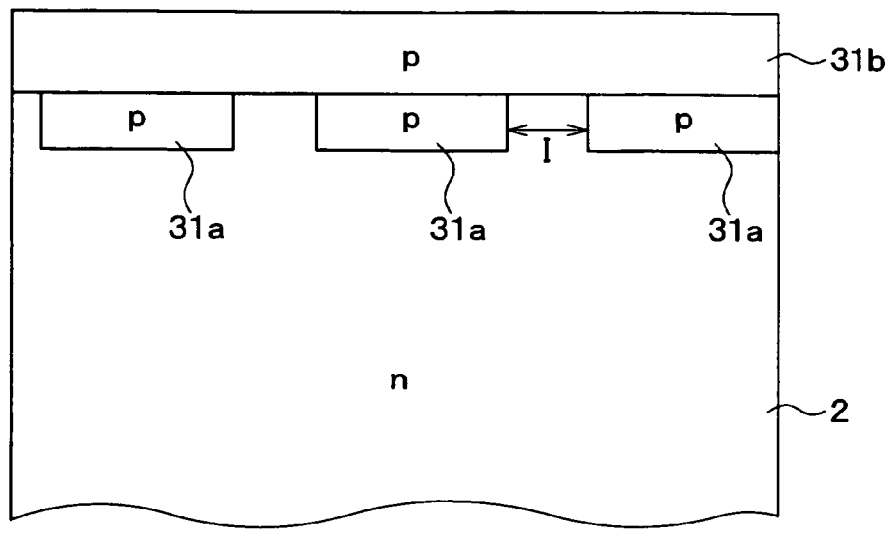
FIG. 8 is a sectional view of a peripheral region used in a simulation for the investigation of breakdown voltage.
Figure 9:
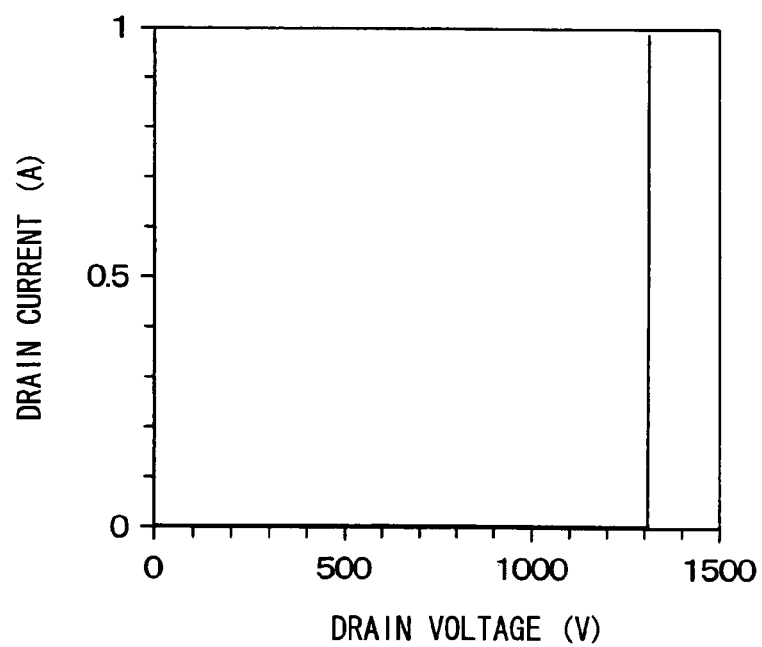
FIG. 9 is a graph indicating the drain voltage-breakdown voltage characteristic observed in the case of FIG. 8.

With respect to the breakdown voltage of the peripheral region, a simulation was actually done. In this simulation, the breakdown voltage obtained when the intervals I between the multiple guard ring lower parts 31a are set to 1.5 μm as illustrated in the sectional view of FIG. 8. FIG. 9 indicates the result obtained from this simulation. As indicated in this drawing, so high a breakdown voltage that a drain current does not flow until the drain voltage becomes equal to or higher than 1300V could be obtained.

Figure 10:
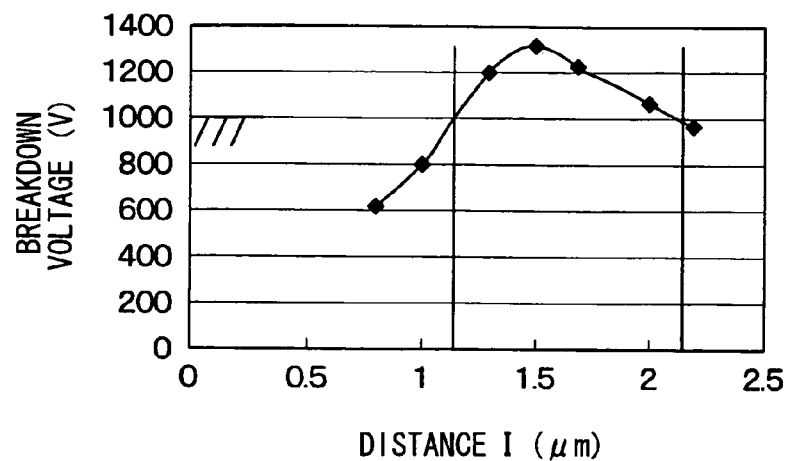
FIG. 10 is a graph indicating a result obtained by investigating change in breakdown voltage with the intervals between multiple peripheral region lower parts varied.

An investigation was also carried out into change in breakdown voltage observed when the intervals I between the multiple guard ring lower parts 31a are varied. FIG. 10 indicates the result obtained from this investigation, and the following was verified: as high a breakdown voltage as 1000V or above can be obtained when the intervals I are 1.1 μm to 2.2 μm or so and a high breakdown voltage exceeding 1300V can be obtained especially when the intervals are 1.5 μm. To find the reason for this, an investigation was carried out into the electric potential distribution of the peripheral region under high drain voltage with the intervals I set to 1.0 μm, 1.5 μm, and 2.2 μm. FIGS. 11A to 11C indicate the result obtained from this investigation.

FIG. 11A indicates the electric potential distribution observed when the intervals I are set to 1.0 μm. Though equipotential lines are extended to the most peripheral side of the peripheral region, the spacing between the equipotential lines is small and the spread of the electric potential distribution is narrow. For this reason, it can be said that when the intervals I are reduced too much, the breakdown voltage is conversely reduced. FIG. 11B indicates the electric potential distribution observed when the intervals I are set to 1.5 μm. It is apparent from this drawing that the spacing between the equipotential lines is larger and the spread of the electric potential distribution is also wider than in FIG. 11A. For this reason, a higher breakdown voltage can be obtained. FIG. 11C indicates the electric potential distribution observed when the intervals I are set to 2.2 μm. Since the intervals I are increased too much, an electric field gets into the intervals I in a concentrated manner and a breakdown voltage cannot be obtained.

When the intervals I between the multiple guard ring lower parts 31a are set to 1.1 μm to 2.2 μm or so, as mentioned above, a higher breakdown voltage can be obtained.

Fourth Embodiment

In the third embodiment, the intervals I between the multiple guard ring lower parts 31a are equal. In this embodiment, the intervals I between the guard ring lower parts 31a are made unequal.

Figure 12:
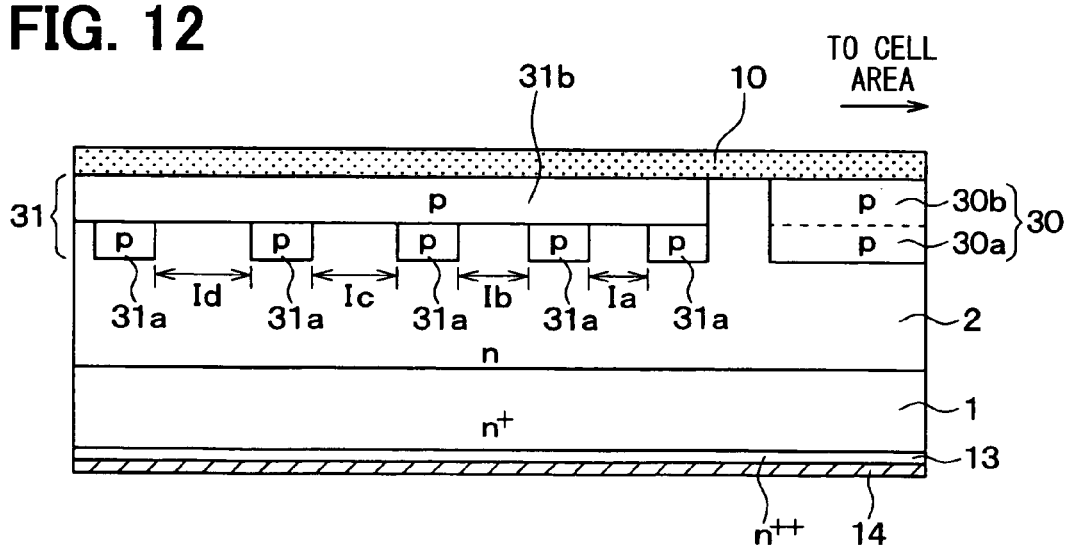
FIG. 12 is a sectional view of a planar MOSFET of such a structure that the intervals between multiple peripheral region lower parts are increased as it goes away from a cell area.
Figure 13:
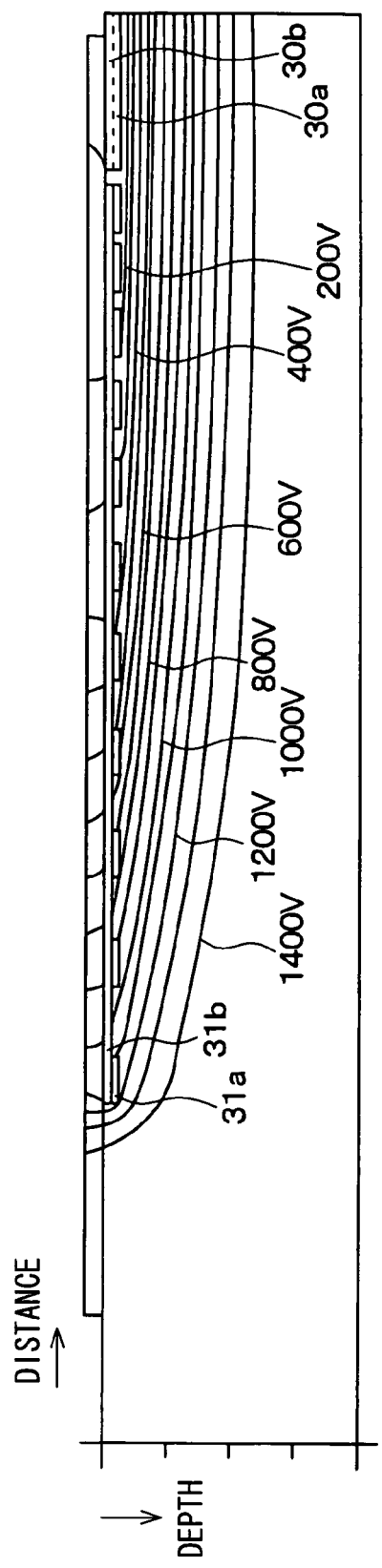
FIG. 13 is an electric potential distribution chart in the case of FIG. 12.
Figure 14:
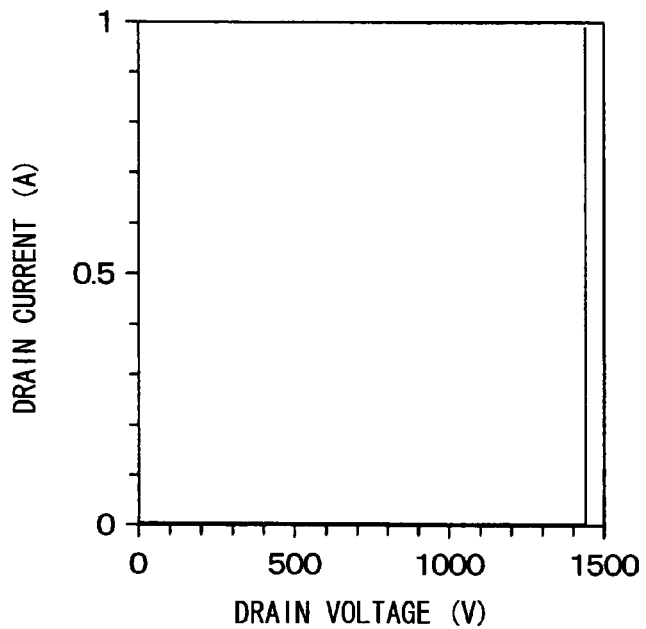
FIG. 14 is a graph indicating the drain voltage-breakdown voltage characteristic observed in the case of FIG. 12.

When the intervals I between the multiple guard ring lower parts 31a are all set to 1.5 μm, as mentioned above, a high breakdown voltage can be obtained. As illustrated in FIG. 11A, however, the spacing between the equipotential lines is large but the spacing between equipotential lines is not so large in a low-voltage range in proximity to the cell area. To cope with this, the peripheral region was set as shown in the sectional view of FIG. 12, and the electric potential distribution characteristic in the peripheral region was investigated. Specifically, the peripheral region was so structured that the intervals I between the multiple guard ring lower parts 31a are increased as it goes away from the cell area (Ia<Ib<Ic<Id in the drawing). As a result, it was found that the spacing between equipotential lines was large in a low-voltage range as well, as indicated in FIG. 13. The breakdown voltage in this case was investigated, and as high a breakdown voltage as 1442V was obtained as illustrated in FIG. 14.

As mentioned above, the breakdown voltage of the peripheral region can be made higher by structuring it so that the intervals between the multiple guard ring lower parts 31a are increased as it goes away from the cell area.

Fifth Embodiment

Figure 15A:
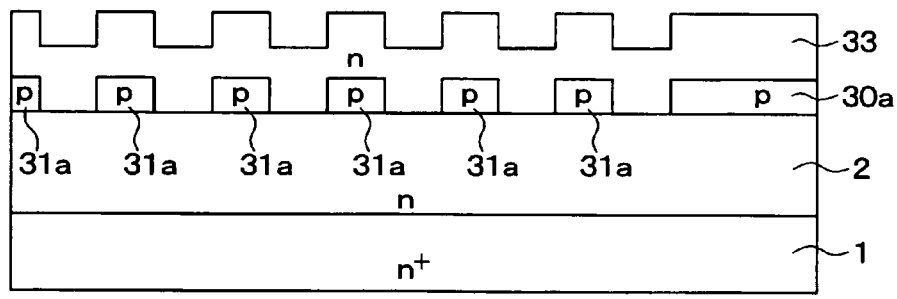
FIGS. 15A and 15B are a set of sectional views illustrating manufacturing steps for a peripheral region in a fifth embodiment.
Figure 15B:
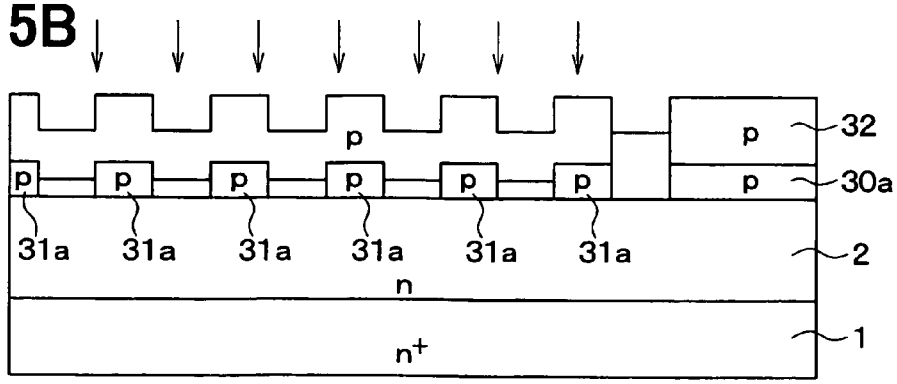

Some of the steps of forming the p type guard ring upper part 31b in the third and fourth embodiments may be modified. FIGS. 15A and 15B are a set of sectional views illustrating the manufacturing process for the peripheral region in which the steps of FIGS. 7C to 7D in the third embodiment are modified.

After the steps of FIGS. 7A and 7B, the guard ring lower parts 31a are formed over the n type drift layer 2. At the step of FIG. 15A, the n type layer 33 is so formed that it is thinner than at the step of FIG. 7C. At the step illustrated in FIG. 15B, a p type impurity is ion implanted to form the guard ring upper part 31b without carrying out such a planarization step by polishing as illustrated in FIG. 7D.

As mentioned above, it is unnecessary to planarize the n type layer 33. This step can be combined with a process in which the step of polishing the n type layer 21 is not carried out as in the second embodiment. This makes it possible to simplify the manufacturing process for the planar MOSFET.

Other Embodiments

In the description of the above embodiments, cases where the p type base regions 3 are divided into the lower parts 3a and the upper parts 3b when they are formed are taken as examples. Instead, the entire p type base regions 3 may be formed by epitaxial growth. FIGS. 16A to 16D are a set of sectional views illustrating the manufacturing process for the planar MOSFET in this case, and illustrates steps that are substituted for the steps of FIGS. 2B to 2D and FIG. 3A.

Figure 16A:
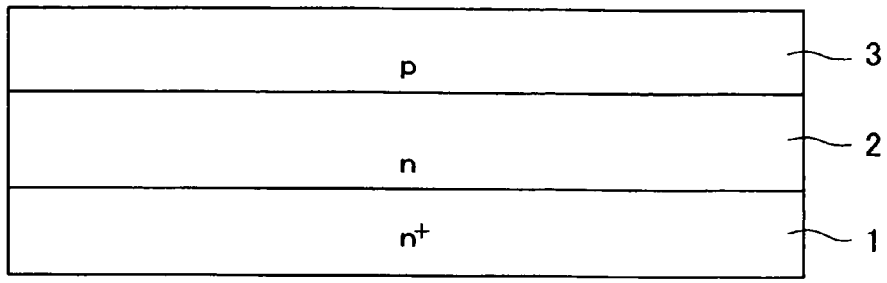
FIGS. 16A to 16D are a set of sectional views illustrating part of the manufacturing process for a planar MOSFET in another embodiment.
Figure 16B:
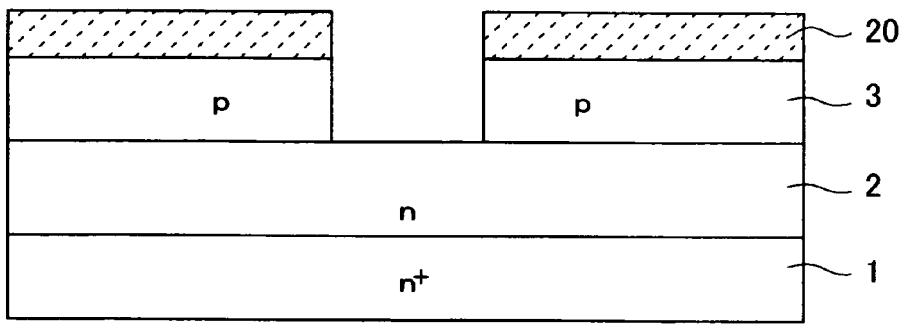
Figure 16C:
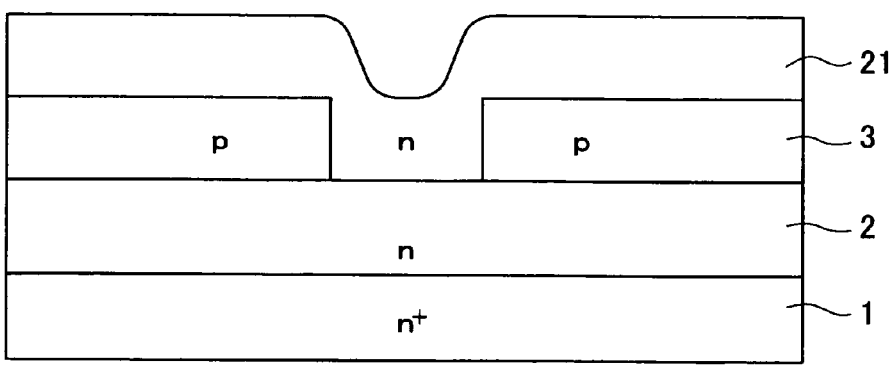
Figure 16D:
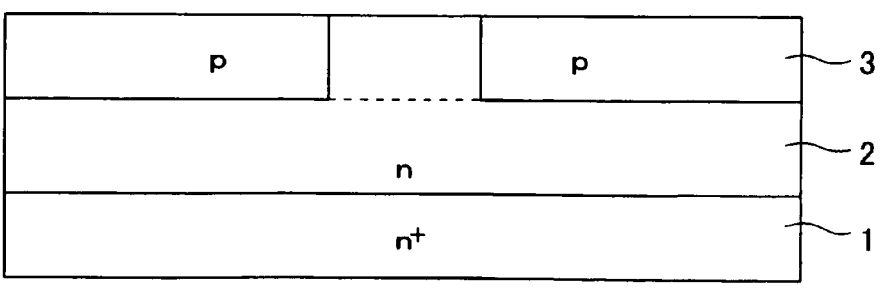

After the step of FIG. 2A is carried out, the entire p type base region 3 is formed over the n type layer 21 by epitaxial growth at the step illustrated in FIG. 16A. At the subsequent step illustrated in FIG. 16B, the p type base region 3 is patterned using the mask 20. At the step illustrated in FIG. 16C, the mask 20 is removed and then the n type layer 21 is formed. At the subsequent step illustrated in FIG. 16D, the n type layer 21 is removed by polishing until the p type base regions 3 are exposed. Also with this construction, the planar MOSFET of the same structure as in the above embodiments can be obtained.

In the above embodiments, the lower part 3a of the p type base region 3 is epitaxially grown and is patterned and then the n type layer 21 is formed. Instead, the following procedure may be taken: the n type drift layer 2 is formed to a slightly larger thickness, and then part of the n type drift layer 2 is removed and the p type base region 3 is filled there. FIGS. 17A to 17D are a set of sectional view illustrating the manufacturing process for the planar MOSFET in this case, and illustrates steps that are substituted for the steps of FIGS. 2A to 2D and FIGS. 3A and 3B.

Figure 17A:
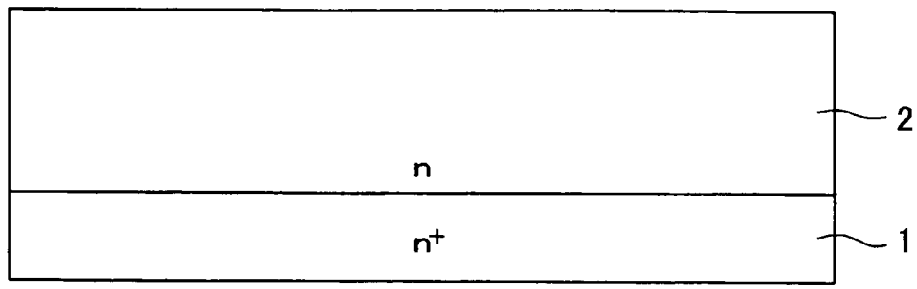
FIGS. 17A to 17D are a set of sectional views illustrating part of the manufacturing process for a planar MOSFET in another embodiment.
Figure 17B:
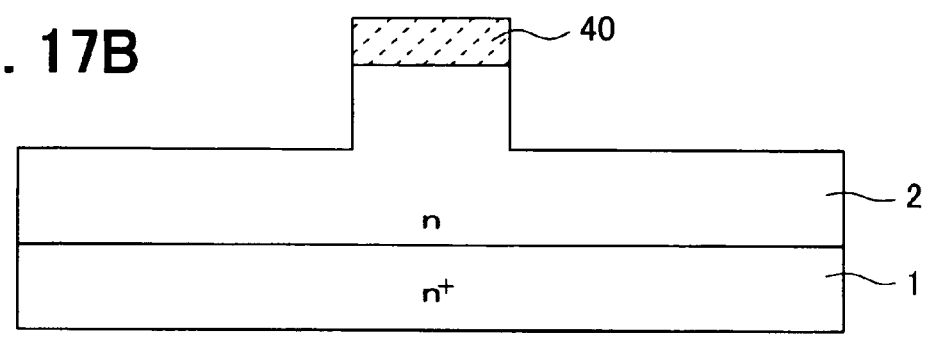
Figure 17C:
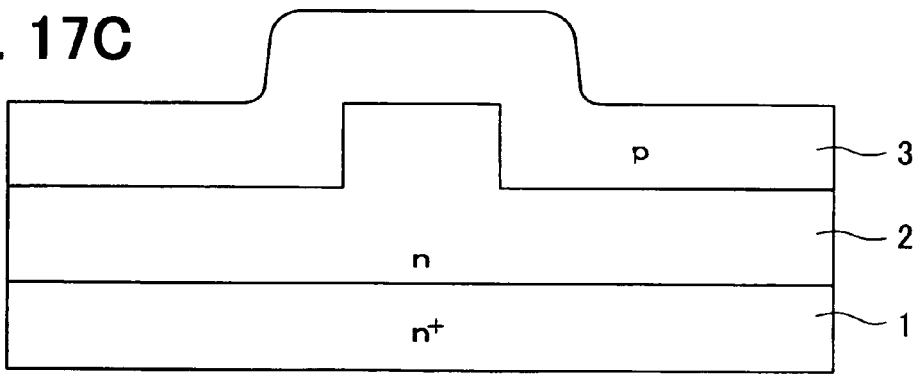
Figure 17D:
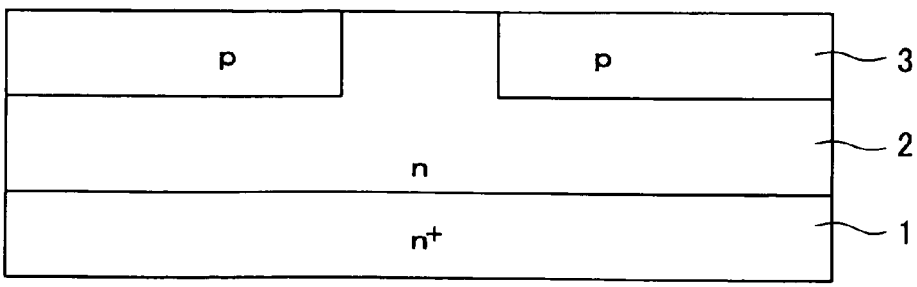

At the step illustrated in FIG. 17A, the n type drift layer 2 is formed to a slightly larger thickness over the n+ type substrate 1. At the subsequent step illustrated in FIG. 17B, a mask 40 open at portions corresponding to the regions where the p type base regions 3 are to be formed over the n type drift layer 2 is placed. Using the mask 40, thereafter, etching is carried out to remove the n type drift layer 2 by 0.7 μm or so. At the step illustrated in FIG. 17C, the mask 40 is removed and the p type base region 3 is epitaxially grown over the surface of the n type drift layer 2. At the step illustrated in FIG. 17D, the p type base region 3 is polished and planarized until the n type drift layer 2 is exposed. Also with this construction, the planar MOSFET of the same structure as in the above embodiments can be obtained.

In the description of the above embodiments, an accumulation planar MOSFET are taken as examples. Alternatively, an inversion planar MOSFET in which the channel epi-layer 4 is not formed may be formed. In the above description, planar MOSFETs are taken as examples of vertical power MOSFETs. The planar MOSFET may be of any other type, for example, of trench gate type. That is, cases where leakage arising from BPD occurs in an area of boundary between the lower part of a base region and a drift layer may be applied.

In the third to fifth embodiments, the guard ring upper part 31b is formed. However, the guard ring upper part 31b is not indispensable because an electric field extended to a peripheral region can be gradually expanded as long as guard ring lower parts 31a are formed.

When a crystal orientation is indicated, a bar (−) is supposed to be attached to above a desired numeric character. In this specification, a bar is prefixed to a desired numeric character because of limitation on expression associated with application from PCs.

The above disclosure has the following aspects.

According to a first aspect of the present disclosure, a method for manufacturing a silicon carbide semiconductor device includes: preparing a substrate made of silicon carbide having a (11-20)-orientation surface as a principal surface; forming a drift layer having a first conductivity type on the substrate; forming a base region having a second conductivity type in a surface portion of the drift layer by doping a second conductivity type impurity; forming a first conductivity type region in the base region in such a manner that the first conductivity type region has an impurity concentration higher than that of the drift layer; forming a channel region having the first conductivity type on a surface of the base region to couple between the drift layer and the first conductivity type region; forming a gate insulating film on a surface of the channel region; forming a gate electrode on the gate insulating film; forming a first electrode to electrically connect to the first conductivity type region; and forming a second electrode on a backside of the substrate. The device is capable of controlling current between the first electrode and the second electrode through the first conductivity type region and the drift layer by controlling a channel formed in the channel region with an applied voltage to the gate electrode, and the forming the base region includes forming a lower part of the base region on the drift layer by an epitaxial growth method, the lower part contacting the drift layer.

As mentioned above, the lower part of the base region is formed by epitaxial growth, not by ion implantation. This makes it possible to suppress the occurrence of leakage arising from BPD at a PN junction formed between the drift layer and the lower part of the base region. That is, it can be suppressed at a PN junction requiring a function of holding high voltage. Therefore, it is possible to suppress leakage at a PN junction having a function of holding high voltage in a power device formed over an (11-20) face and to suppress decline in the functions of the power device due to leakage.

According to a second aspect of the present disclosure, a method for manufacturing a silicon carbide semiconductor device includes: preparing a substrate made of silicon carbide having a (11-20)-orientation surface as a principal surface; forming a drift layer having a first conductivity type on the substrate; forming a base region having a second conductivity type in a surface portion of the drift layer by doping a second conductivity type impurity; forming a first conductivity type region in the base region in such a manner that the first conductivity type region has an impurity concentration higher than that of the drift layer; forming a gate insulating film on a surface portion of the base region between the drift layer and the first conductivity type region, the surface portion providing a channel; forming a gate electrode on the gate insulating film; forming a first electrode to electrically connect to the first conductivity type region; and forming a second electrode on a backside of the substrate. The device is capable of controlling current between the first electrode and the second electrode through the first conductivity type region and the drift layer by controlling the channel with an applied voltage to the gate electrode, and the forming the base region includes forming a lower part of the base region on the drift layer by an epitaxial growth method, the lower part contacting the drift layer.

In the above device, it is possible to suppress leakage at a PN junction having a function of holding high voltage in a power device formed over an (11-20) face and to suppress decline in the functions of the power device due to leakage.

Alternatively, the forming the base region may further include forming an upper part of the base region on the lower part. The forming the upper part includes: implanting a second conductivity type impurity having the second conductivity type into a part of the first conductivity type layer; and performing activation heat treatment for diffusing the second conductivity type impurity toward a <11-20> direction in the part of the first conductivity type layer. Further, the forming the lower part of the base region may include: epitaxially growing a second conductivity type layer on a surface of the drift layer; forming a mask having an opening on the second conductivity type layer, wherein the opening corresponds to a base-region-to-be-formed region of the second conductivity type layer; and etching the second conductivity-type layer with using the mask to partly expose the drift layer and to form the lower part of the base region. The forming the first conductivity type region includes epitaxially growing the first conductivity type layer on the lower part of the base region and the drift layer, and the implanting the second conductivity type impurity into the part of the first conductivity type layer includes implanting the second conductivity type impurity into a base-region-to-be-formed region of the first conductivity type layer. Furthermore, the method may further include: planarizing the first conductivity type layer, wherein the implanting the second conductivity type impurity into the part of the first conductivity type layer and the performing the activation heat treatment are performed after the planarizing.

Alternatively, the drift layer, the base region, the first conductivity type region, the channel region, the gate insulating film, the gate electrode and the first and second electrodes may provide a semiconductor element. The method may further include: arranging the semiconductor element in a cell area; and forming a RESURF layer having the second conductivity type in a surface portion of the drift layer in a periphery area, which surrounds the cell area. The forming the RESURF layer includes forming a RESURF lower part of the RESURF layer on the drift layer by an epitaxial growth method. In this case, the RESURF lower part of the RESURF layer forming a PN junction with the drift layer is also formed by epitaxial growth. This makes it possible to enhance the breakdown voltage of the peripheral region. Further, the forming the RESURF layer may further include forming a RESURF upper part of the RESURF layer on the RESURF lower part. The forming the RESURF upper part includes: forming another first conductivity type layer on the RESURF lower part; implanting a second conductivity type impurity having the second conductivity type into the another first conductivity type layer; and performing activation heat treatment for providing the RESURF upper part. Furthermore, the performing activation heat treatment may provide to diffuse the second conductivity type impurity in the <11-20> direction.

Alternatively, the method may further include: forming a guard ring portion in the peripheral region between the RESURF layer and the cell area. The forming the guard ring portion includes forming a plurality of guard ring lower parts of the guard ring portion on the drift layer by an epitaxial growth method, and the plurality of guard ring lower parts is arranged at predetermined intervals on the drift layer. In this case, the guard ring lower parts of the guard ring portion forming a PN junction with the drift layer are also formed by epitaxial growth. This makes it possible to enhance the breakdown voltage of the peripheral region. Further, the forming the guard ring portion further may include forming a guard ring upper part of the guard ring portion on the guard ring lower part. The forming the guard ring upper part includes: forming another first conductivity type layer on the guard ring lower parts; implanting a second conductivity type impurity having the second conductivity type into the another first conductivity type layer; and performing activation heat treatment for providing the guard ring upper part.

Alternatively, the second conductivity type impurity is boron or aluminum. It is known that when boron is used, especially, the diffusion coefficient at the (11-20) face is dramatically higher than at any other face. This makes it possible to form a PN junction over the (11-20) face by boron ion implantation and thereafter carrying out activation heat treatment and to thereby shift the PN junction area into the high-quality drift layer. Thus, a PN junction with low leakage current can be formed.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a silicon carbide semiconductor device comprising:
   preparing a substrate made of silicon carbide having a (11-20)-orientation surface as a principal surface;
   forming a drift layer having a first conductivity type on the substrate;
   forming a base region having a second conductivity type in a surface portion of the drift layer by doping a second conductivity type impurity;
   forming a first conductivity type region in the base region in such a manner that the first conductivity type region has an impurity concentration higher than that of the drift layer;
   forming a channel region having the first conductivity type on a surface of the base region to couple between the drift layer and the first conductivity type region;
   forming a gate insulating film on a surface of the channel region;
   forming a gate electrode on the gate insulating film;
   forming a first electrode to electrically connect to the first conductivity type region; and
   forming a second electrode on a backside of the substrate,
   wherein the device is configured to control current between the first electrode and the second electrode through the first conductivity type region and the drift layer by controlling a channel formed in the channel region with an applied voltage to the gate electrode,
   wherein the forming the base region includes forming a lower part of the base region on the drift layer by an epitaxial growth method, the lower part contacting the drift layer,
   wherein the forming the base region further includes forming an upper part of the base region on the lower part, and
   wherein the forming the upper part includes:
      forming a first conductivity type layer on the drift layer;
      implanting a second conductivity type impurity having the second conductivity type into a part of the first conductivity type layer; and
      performing activation heat treatment for diffusing the second conductivity type impurity toward a <11-20> direction in the part of the first conductivity type layer,
   the forming the lower part of the base region includes:
      epitaxially growing a second conductivity type layer on a surface of the drift layer;

forming a mask having an opening on the second conductivity type layer, wherein the opening corresponds to a base-region-to-be-formed region of the second conductivity type layer; and etching the second conductivity-type layer with using the mask to partly expose the drift layer and to form the lower part of the base region, the forming the first conductivity type region includes epitaxially growing the first conductivity type layer on the lower part of the base region and the drift layer, and the implanting the second conductivity type impurity into the part of the first conductivity type layer includes implanting the second conductivity type impurity into a base-region-to-be-formed region of the first conductivity type layer.

2. The method according to claim 1, further comprising:
planarizing the first conductivity type layer, wherein
the implanting the second conductivity type impurity into the part of the first conductivity type layer and the performing the activation heat treatment are performed after the planarizing.

3. The method according to claim 1, wherein
the base region is entirely formed by the epitaxial growth method in the forming the base region so that the upper and lower parts of the base region are successively formed.

4. The method according to claim 1, wherein
the drift layer, the base region, the first conductivity type region, the channel region, the gate insulating film, the gate electrode and the first and second electrodes provide a semiconductor element,
the method further comprising:
arranging the semiconductor element in a cell area; and
forming a RESURF layer having the second conductivity type in a surface portion of the drift layer in a periphery area, which surrounds the cell area, wherein
the forming the RESURF layer includes forming a RESURF lower part of the RESURF layer on the drift layer by an epitaxial growth method.

5. The method according to claim 4, wherein
the forming the RESURF lower part and the forming the lower part of the base region are performed at the same time.

6. The method according to claim 4, wherein
the forming the RESURF layer further includes forming a RESURF upper part of the RESURF layer on the RESURF lower part, and
the forming the RESURF upper part includes:
forming another first conductivity type layer on the RESURF lower part;
implanting a second conductivity type impurity having the second conductivity type into the another first conductivity type layer; and performing activation heat treatment for providing the RESURF upper part.

7. The method according to claim 6, wherein
the performing activation heat treatment provides to diffuse the second conductivity type impurity in the <11-20> direction.

8. The method according to claim 4, further comprising:
forming a guard ring portion in the peripheral region between the RESURF layer and the cell area, wherein
the forming the guard ring portion includes forming a plurality of guard ring lower parts of the guard ring portion on the drift layer by an epitaxial growth method, and
the plurality of guard ring lower parts is arranged at predetermined intervals on the drift layer.

9. The method according to claim 8, wherein
the forming the plurality of guard ring lower parts and the forming the lower part of the base region are performed at the same time.

10. The method according to claim 8, wherein
the forming the guard ring portion further includes forming a guard ring upper part of the guard ring portion on the guard ring lower part, and
the forming the guard ring upper part includes:
forming another first conductivity type layer on the guard ring lower parts and the drift layer;
implanting a second conductivity type impurity having the second conductivity type into the another first conductivity type layer; and
performing activation heat treatment for providing the guard ring upper part.

11. The method according to claim 10, wherein
the performing activation heat treatment provides to diffuse the second conductivity type impurity in the <11-20> direction.

12. The method according to claim 8, wherein
the predetermined intervals are equal, and
the predetermined intervals are in a range between 1.1 μm to 2.2 μm.

13. The method according to claim 12, wherein
the predetermined intervals are equal to 1.5 μm.

14. The method according to claim 8, wherein
the predetermined intervals become larger as a distance between the guard ring lower part and the cell area becomes larger.

15. The method according to claim 1, wherein
the second conductivity type impurity is boron.

16. The method according to claim 1, wherein
the second conductivity type impurity is aluminum.

17. The method according to claim 1, wherein
the first conductivity type layer is firmed on the drift layer and over the lower part of the base region.

* * * * *